United States Patent [19]

Govaert

[11] Patent Number: 4,950,978

[45] Date of Patent: Aug. 21, 1990

[54] ATMOSPHERIC POTENTIAL MEASUREMENT DEVICE

[75] Inventor: Johan A. Govaert, Peabody, Mass.

[73] Assignee: Airborne Research Associates, Inc., Weston, Mass.

[21] Appl. No.: 281,842

[22] Filed: Dec. 8, 1988

[51] Int. Cl.[5] ............................................. G01R 29/12
[52] U.S. Cl. ..................................................... 324/72
[58] Field of Search ......................... 324/72, 72.5, 149

[56] References Cited

U.S. PATENT DOCUMENTS

| | | | |
|---|---|---|---|
| 2,199,757 | 5/1940 | Rohde | 324/72 |
| 3,121,196 | 2/1964 | Kasemir | 324/72 |
| 3,215,997 | 11/1965 | Leavitt et al. | 340/253 |
| 3,707,674 | 12/1972 | Bahder et al. | 324/72 |
| 3,760,268 | 9/1973 | Ruhnke | 324/72 |
| 3,857,066 | 12/1974 | Cline et al. | 324/109 |
| 4,262,254 | 4/1981 | Poss | 324/457 |
| 4,473,857 | 9/1984 | Winter | 324/72.5 |

OTHER PUBLICATIONS

Markson et al., "Comparison of KSC Field Mill Surface Electric Fields and Corona Derived 20 Meter Potentials", A41A-11 aa EOS (Trans. Amer. Geophys. Union), vol. 69, No. 44, p. 1071 (Nov. 1988).

Primary Examiner—Reinhard J. Eisenzopf
Assistant Examiner—Maura K. Regan
Attorney, Agent, or Firm—Fish & Richardson

[57] ABSTRACT

A device to remove the dead band in atmospheric electric potential measurements while maintaining a low leakage path to ground. In one embodiment the device comprises a AC high voltage source connected through a high ohm resistor and capacitor network to a sharp corona point and a means for measuring the current through the corona point.

8 Claims, 3 Drawing Sheets

ATMOSPHERIC POTENTIAL MEASUREMENT DEVICE

BACKGROUND OF THE INVENTION

The government has rights to this invention pursuant to a Small Business Innovation Research Contract awarded by the National Aeronautics and Space Administration, Contract Number NAS10-11412.

This invention relates to the field of electrostatic potential measuring devices.

Earth's atmosphere has an electrical potential gradient which varies according to weather conditions. In fair weather the potential gradient at the ground is about 120V/m ±20%. The polarity of the potential gradient is with the earth negative with respect to the atmosphere which is positive. During fair weather, the magnitude of the potential varies over a period of a day, typically reaching a maximum value of about 150 V/m and a minimum valve of about 100 V/m. This diurnal variation in fair weather potential gradiant is caused by the variation of the intergrated charging currents from all global thunderstorms.

As electrical activity in the atmosphere increases, due for example to the presence of a separation of charge in a cloud, the potential gradient (electric field intensity) increases to about 1000 V/m. When the field exceeds about 1000 V/m, it is a definite indication of developing thunderstorm activity. This magnitude of electric field is a good indicator because it is the result of a large separation of charge in the cloud, which is a characteristic of thunderstorms. As the cloud electrification increases, the electric field will grow to about 5-10 kV/m near the ground. The reason the field intensity at the ground does not increase even further, although electric field intensity near the cloud becomes much greater, is that grounded conductors on the ground begin to ionize the air molecules near the points and edges of the conductor. This is referred to as the conductor going into corona discharge. Grounded conductors with sharp points or edges begin to go into corona discharge when their potential exceeds a threshold voltage of 1-3 kV. Corona discharge creates charge in the space near the ground of such polarity as to decrease the electric field near the ground. As an observer moves higher into the atmosphere, away from this blanket of space charge near to the ground, the field strength grows quickly and near a thundercloud the electric field may exceed 50,000–100,000 V/m.

Once lightning occurs, some of the electric charge in the cloud is removed or rearranged and the electric potential gradient under the cloud will often decrease sharply. However, the field will increase again as the charges continue to separate within the cloud. Furthermore, following a lightning discharge there can be a reversal in polarity as the field due to the space charge near the ground exceeds the field due to the charge remaining in the cloud.

The measurement of the electric potential at a point above the earth's surface, e.g. on a pole, is an important indicator of thunderstorm activity. Many methods of measuring the atmospheric electric field strength have been developed in order to determine thunderstorm electrical intensity.

One method of making an electric potential measurement from which the electric field can be derived is to place a grounded conducting point called a corona point into the atmosphere and measure the amount of current that flows through the point between the ground and the air. The problem is that no current flows until the point itself goes into corona discharge. As mentioned previously, all grounded conductors will go into corona if their potential is high enough. The potential at which something goes into corona is in part determined by its sharpness. The sharper a point, the easier it is to go into corona. For the sharpest corona points, corona discharge occurs at about 1000 V. This means that corona points cannot be used to detect fields producing point potentials of less than 1000 V.

Referring to FIG. 1, this is a plot of the corona point current (I) versus the atmospheric electric field (E) or point potential (V). In a standard corona point the current electric field relationship is shown by curve 100. For electric fields less than this threshold 105, there is no corona discharge and there is no current flow. This region on the curve extending from the negative threshold 104, through zero 103 to the positive threshold of corona discharge 105 is termed the dead band.

Several devices have been developed to create ions in the vicinity of the point and thereby lower the threshold. One device is a radioactive probe which produces ion pairs in the vicinity of the point through radioactive decay of an isotope near the point. This device produces a small number of pairs at all times and thereby lowers the threshold potential to some degree. However, once corona begins, all the ions present are swept away.

A better way to overcome the threshold is to place the point into corona at all times through the use of a high voltage applied to the corona point. Referring to FIG. 2, such an atmospheric field corona point measuring device known in the prior art consists of a corona point 210 which is attached to the secondary windings 214 of a transformer 212. The primary windings 216 of transformer 212 are connected to an AC power supply 218. The transformer 212 steps up the voltage on the secondary windings 214 and keeps the corona point 210 at an elevated potential. The other terminal of the secondary winding 214 is connected to a low pass filter consisting primarily of a resistor 222 and a capacitor 220 connected in parallel and to ground 224. This low pass filter removes the AC from the voltage source 218 and permits only DC from the corona point current flow to be amplified by amplifier 228 prior to being measured by the measuring device 230.

The reason for placing an elevated potential on the corona point can be seen also by referring to FIG. 1. When a high voltage AC potential 116 is supplied to the corona point 210, positive and negative ions are given off as the applied voltage swings positive 118 and negative 120. As a result of the presence of this ion cloud surrounding the corona point, there is current almost constantly flowing. This is shown by the current versus electric field or point potential curves 114 and 115 which are generated when a high voltage AC source is applied to the corona point.

The actual shape of the curve, that is which curve, 114 or 115, is generated, is determined by the wind conditions near the corona tip. In high wind, the space charge cloud formed near the tip which inhibits current flow is swept away and the resulting current flow is greater for a given electric field strength 115. In still air, the space charge near the corona point 210 builds up, resulting in a decrease in current flow for a given field strength 114. The effects occur because the ion cloud creates an electric field which opposes the ambient field to be measured; it in effect acts like a back electromotive force. It will be noted that the curve is not symmetric about the zero electric field point. It is however, symmetric about a value of the field 110 which is displaced 112 by about two hundred volts from the zero field potential 103. This asymmetry is thought to result from the differences in the potential at which positive and negative ions are emitted from the corona point; the negative corona occuring at a lower potential.

U.S. Pat. Nos. 3,847,066 and 4,262,254 disclose measuring devices of this type. While these devices did eliminate the dead band, they suffered from the presence of the secondary 214 of the transformer 212 in the circuit with the corona point 210. It is necessary to keep the actual current flow through the corona point low to achieve wind independence. Referring to FIG. 3, although not suggested in the prior art just described, to achieve wind independence, one might suppose a high ohm resistor 300 could be placed into the path between the transformer 212 and the ground 224, and high electrical isolation provided to the point 210. Typically this resistance 300 is about from 1-10 gigaohms.

Such an arrangement reduces the sensitivity of the configuration to the presence of wind, that is, causes the high and low wind current values for a given field strength to be approximately equal. This insensitivity to the wind is the result of the relative resistances of the high resistance 300 and the ion cloud surrounding the corona point 210. The ion cloud has a resistance of about $5 \times 10^9$ ohms, while the high ohm resistor 300 has a resistance of about $5 \times 10^{10}$ ohms. About 90% or more of the resistance is TM -in the fixed high resistance resistor 300 rather than in the wind dependent ion cloud resistance. Wind, therefore, has less of an affect than if the ion cloud resistance were a larger fraction of the total resistance.

The problem becomes that with a transformer 212 coupling the power supply 218 to the corona point 210, the current flow from the corona point 210 to ground 224 between the secondary 214 and the primary 216 of the transformer 212 increases as the resistance 300 becomes large. When a gigaohm resistance 300 is used, present transformer technology cannot provide insulation sufficient to limit this leakage current through a conventional transformer.

The present invention provides the benefit of the high voltage to the corona point without the associated leakage current.

DESCRIPTION OF THE DRAWING

This invention is pointed out with particularity to the appointed claims. The following discussion may be better understood with reference to the drawing in which:

DESCRIPTION OF THE PREFERRED EMBODIMENT

Figure 4:
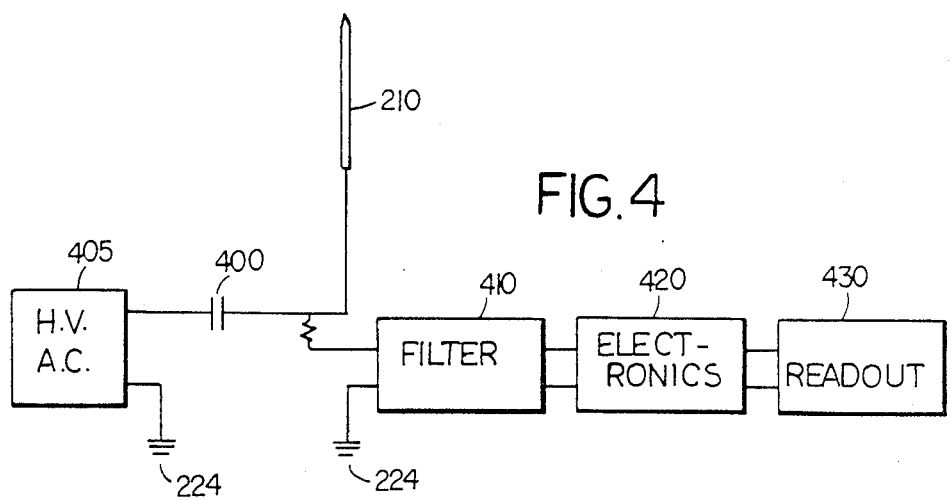
FIG. 4 is a block diagram of an embodiment of the invention.
Figure 3:
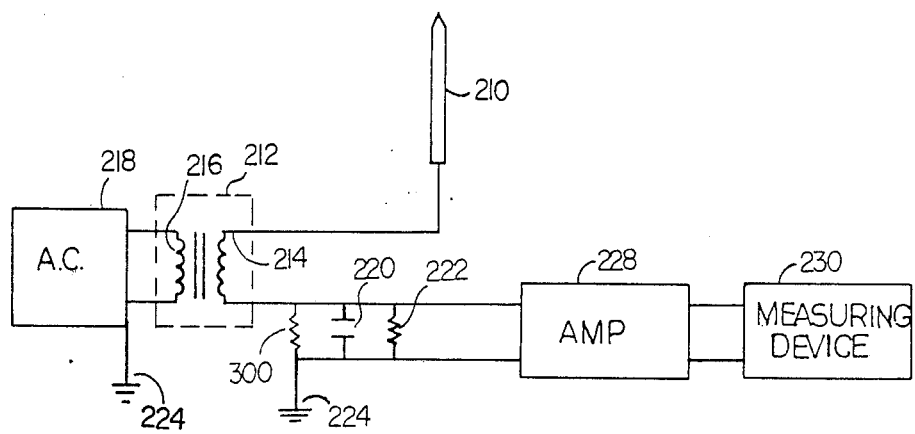
FIG. 3 is a block diagram of an embodiment of an electric field measuring device with a high voltage source and a high ohm resistor.

Referring to FIG. 4, in one embodiment of the invention, the corona point 210 is attached to one terminal of a high voltage AC supply 405 operating at about 3 kV through a high voltage capacitor 400 and also to one terminal of a filter 410 through a high ohm resistor 300 having a value in the range of 1-10 gigaohms. The other terminal of the high voltage supply is connected to ground 224 as is the second terminal of the filter 410. The high voltage supply 405 may alternatively generate pulsed DC.

The corona point is made of stainless steel chemically etched to a very sharp point by placing a sharpened stainless steel needle as one electrode in an electrolytic cell connected across a low voltage DC power supply (approximately 3 V. at 300 milliamps) in an approximately 8M Sulfuric Acid solution. When the process is completed, the corona point will go into corona when it is raised to a potential of about 800 V. It is observed that within a short time, however, the corona point requires higher and higher voltages to go into corona, but that it finally stabilizes at about 1500 V. This increase is assumed to result from an eroding of the point by the current flow. It indicates that it is not possible to eliminate the dead band simply by creating sharper points on the corona point 210 or to change the current voltage relationship. It has been determined that when high voltage is supplied, ions are always present near the point and there is no dead band. It is also known that with high voltage applied to the corona point 210, continued deterioration of the sharpness of the point due to corrosion does not increase the dead zone.

The high voltage capacitor 400 isolates the high voltage supply 405 from the high potentials experienced by the corona point 210. The filter 410 prevents any AC from reaching the detector electronics 420 and 430. Additionally, the capacitor 400 provides high isolation, in excess of $10^{12}$ ohms, which, when used with the resistor 300 having a resistance of $10^{10}$ ohms, leads to a maximum leakage of about 1% through the capacitor 400. By combining multiple resistors, capacitors and insulating the point, it is not difficult to achieve high electrical isolation with currently available components.

Figure 1:
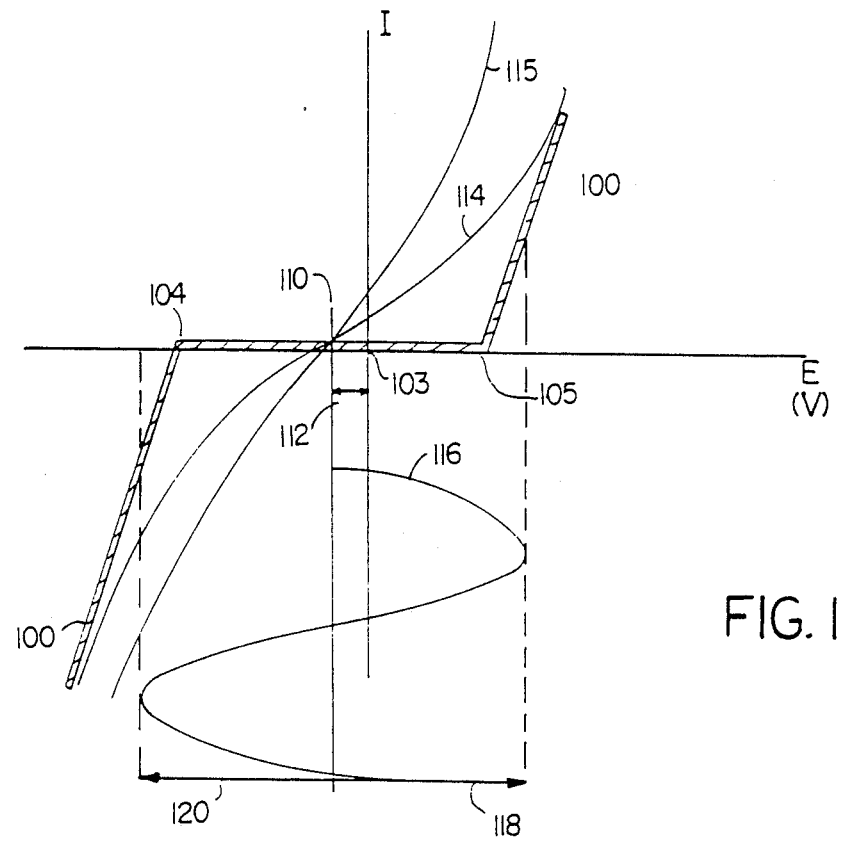
FIG. 1 is a graph of the corona current versus the electric field or point potential.
Figure 5:
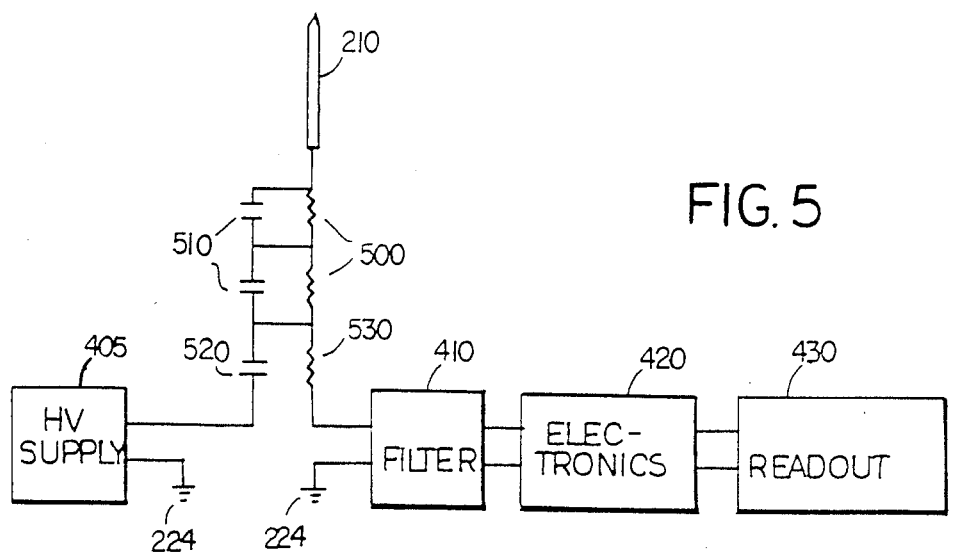
FIG. 5 is a block diagram of an embodiment of the invention with a high ohm input resistor and capacitor network.
Figure 2:
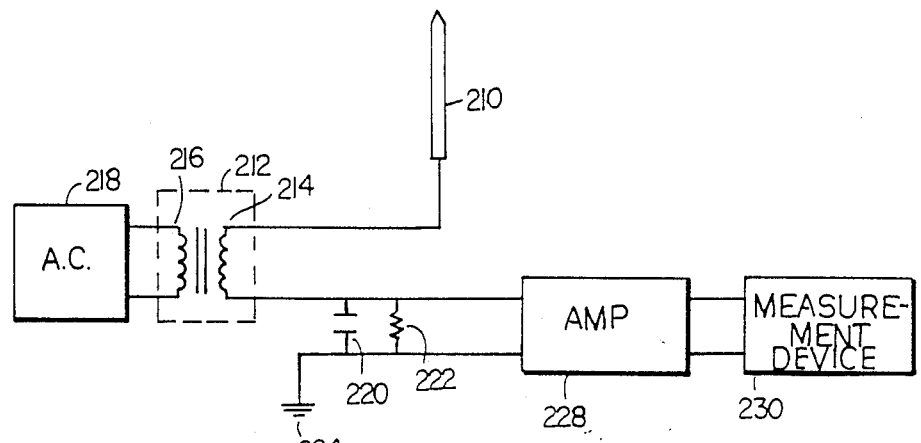
FIG. 2 is a block diagram of an electric field measuring device known in the prior art.

Referring also to FIG. 5, such an embodiment of the invention involves a series of resistors 500 and capacitors 510 connected in parallel with each other and connected in series to the corona point 210. The last resistor 530 and capacitor 520 in the chain are not connected in parallel. Instead the last capacitor 520 connects the high voltage supply 405 and corona point 210 and the last resistor 530 connects the filter 410 to the corona point 210. The use of a series of resistors 500 and capacitors 510 divides the potential difference between the corona point 210 and ground 224 across multiple resistors 500 and capacitors 510, placing less voltage across each component. As in the previously described embodiment, the high voltage supply 405 is isolated from the corona point by capacitors 510 and 520. The filter 410, detector 420 and readout 430 are connected across ground 224 and the corona point 210 through the series of resistors 500 and 530.

Figure 6:
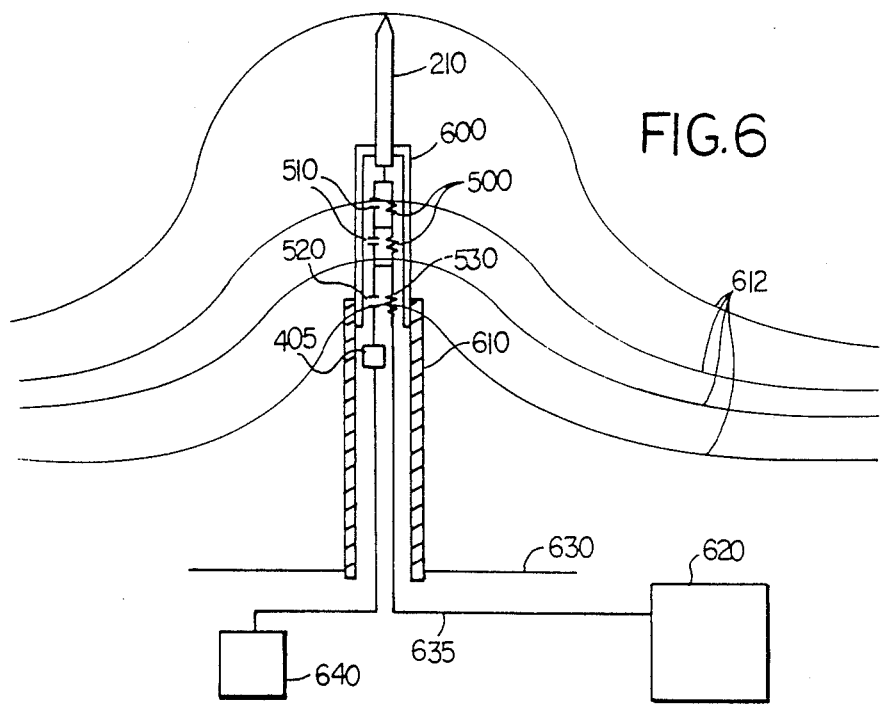
FIG. 6 is a block diagram of the embodiment of FIG. 5 installed in a mast.

Referring to FIG. 6, when the embodiment of FIG. 5 is installed in a structural mast 610 anchored in the earth 630 with the corona point 210 isolated from the mast 610 by an insulating mast 600, the presence of the resistors 500 and 530 and capacitors 510 and 520 perturbs the equipotential lines 612 and separates them in the vicinity of the resistors 500 and 530, thus lessening the stress on them. The mast 610 is typically greater than 5 meters high with the insulating mast being made of a non conductor such as fiberglass. It is possible to locate the high voltage supply 405 within the mast and connect it to a power source 640 located elsewhere. The resistors 500 and 530 located within the insulating mast 600 are connected to the detecting electronics 620 by shielded cable 635. At this height, the fair weather potential gradient is almost sufficient to cause the corona point to go into corona without the applied high voltage.

The present invention permits fair weather as well as thunderstorm atmospheric electric fields to be measured by eliminating the dead band region without an effect due to wind velocity. It does this without a leakage current through the high voltage source and with relative independence of the physical condition of the corona point.

Having shown the preferred embodiment, those skilled in the art will realize many variations are possible which will still be within the scope and spirit of the claims invention. Therefore, it is the intention to limit the invention only as indicated by the scope of the claims.

What is claimed is:

1. An electrostatic potential measuring device comprising a corona point made of a conductor connected in series with a capacitor which in turn is connected to a terminal of a high voltage power supply, said point also connected in series with a high ohm resistor which in turn is connected to a low pass filter, the output signal of said filter being the input signal to a device for determining the current flow through said corona point.

2. An electrostatic potential measuring device comprising a corona point made of a conductor connected in series with a plurality of capacitors which are connected in series and which are in turn connected to a terminal of a high voltage power supply, said point is also connected in series with a plurality of high ohm resistors which are connected in series and which in turn are connected to a low pass filter, the output signal of said filter being the input signal to a device for determining the current flow through said corona point, wherein each of said capacitors and resistors except for the last resistor and capacitor are connected in parallel with each other.

3. The device of claims 1 or 2 wherein said corona point is made of stainless steel.

4. The device of claim 3 wherein said corona point is sharpened by chemical etching.

5. The device of claims 1 or 2 wherein said high voltage is AC.

6. The device of claims 1 or 2 wherein said high voltage is pulsed DC.

7. The device of claims 1 or 2 wherein said corona point is located atop a mast.

8. The device of claim 7 wherein said mast is greater than 5 meters in height.

* * * * *

UNITED STATES PATENT AND TRADEMARK OFFICE
CERTIFICATE OF CORRECTION

PATENT NO. : 4,950,978
DATED : August 21, 1990
INVENTOR(S) : Johan A. Govaert

It is certified that error appears in the above-identified patent and that said Letters Patent is hereby corrected as shown below:

On the title page, item [56] References Cited: under "Other Publications".

"A41A-11 aa EOS" should read --A41A-11 EOS--. Delete "aa".

Col. 3, line 32, "of the resistance is TM-in the fixed high"... should read --of the resistance is in the fixed high--...

Col. 5, line 5, "made of a non con-" should read --made of a non-con- --.

Signed and Sealed this

Seventeenth Day of March, 1992

Attest:

HARRY F. MANBECK, JR.

Attesting Officer

Commissioner of Patents and Trademarks